(12) United States Patent
Grussmann et al.

(10) Patent No.: US 11,601,030 B2
(45) Date of Patent: Mar. 7, 2023

(54) DRIVE DEVICE FOR AN ELECTRICALLY DRIVABLE VEHICLE, AND VEHICLE

(71) Applicant: VALEO SIEMENS EAUTOMOTIVE GERMANY GMBH, Erlangen (DE)

(72) Inventors: Ondřej Grussmann, Zbuzany (CZ); Alexander Frank, Bad Kissingen (DE)

(73) Assignee: VALEO SIEMENS EAUTOMOTIVE GERMANY GMBH, Erlangen (DE)

( * ) Notice: Subject to any disclaimer, the term of this patent is extended or adjusted under 35 U.S.C. 154(b) by 193 days.

(21) Appl. No.: 16/887,009

(22) Filed: May 29, 2020

(65) Prior Publication Data
US 2020/0381977 A1   Dec. 3, 2020

(30) Foreign Application Priority Data

May 29, 2019   (DE) ..................... 10 2019 114 523.6

(51) Int. Cl.
*H02K 11/33* (2016.01)
*H02K 5/22* (2006.01)
*B60K 1/00* (2006.01)
*B60L 3/00* (2019.01)
*H01R 13/512* (2006.01)

(52) U.S. Cl.
CPC ............... *H02K 5/225* (2013.01); *B60K 1/00* (2013.01); *B60L 3/00* (2013.01); *H01R 13/512* (2013.01); *H02K 11/33* (2016.01); *H02K 2213/06* (2013.01)

(58) Field of Classification Search
CPC .... H02K 2213/06; H02K 11/33; H02K 5/225; B60K 1/00; B60L 3/00; H01R 13/512

USPC ........................................................... 310/71
See application file for complete search history.

(56) References Cited

FOREIGN PATENT DOCUMENTS

| CN | 1278947 | * | 1/2001 | ........... H02K 5/0247 |
|---|---|---|---|---|
| DE | 10 2011 004 625 A1 | | 8/2012 | |
| DE | 20 2015 006 792 U1 | | 11/2015 | |

OTHER PUBLICATIONS

Machine translation of DE102011004625, Danzer et al., Aug. 2012 (Year: 2012).*

* cited by examiner

*Primary Examiner* — Terrance L Kenerly
(74) *Attorney, Agent, or Firm* — Manabu Kanesaka

(57) ABSTRACT

A drive device for an electrically drivable vehicle includes a housing body with a first fastening device, a cover which, after release of a second fastening device interacting with the first fastening device for fastening the cover to the housing body, is movable from a first position, in which the cover covers live components of the drive device during operation of the drive device, into a second position, in which the components are exposed, and a first connection device, to which a second connection device is connectable for establishing an electrically conductive connection and/or a data connection. The first fastening device and the first connection device are arranged such that in the first position access to the second fastening means in its position fastening the cover is only possible after the second connection device has been released from the first connection device.

12 Claims, 5 Drawing Sheets

DRIVE DEVICE FOR AN ELECTRICALLY DRIVABLE VEHICLE, AND VEHICLE

RELATED APPLICATIONS

Figure 1:
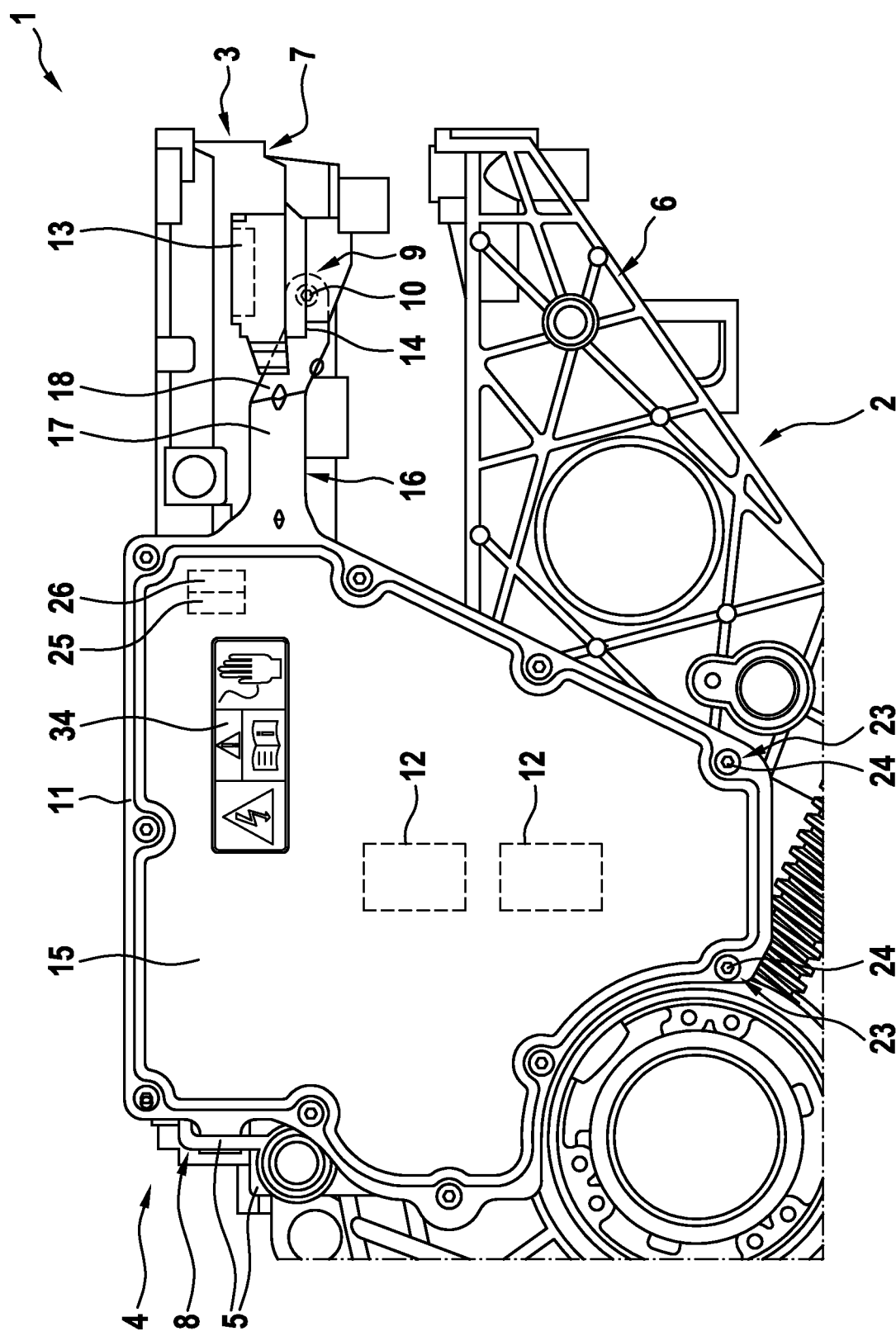

The present application is based on, and claims priority from, German Application No. DE 10 2019 114 523.6 filed May 29, 2019, the disclosure of which is hereby incorporated by reference herein in its entirety.

The present invention relates to a drive device for an electrically drivable vehicle, comprising a housing body with a first fastening means, a cover which, after release of a second fastening means interacting with the first fastening means for fastening the cover to the housing body, is movable from a first position, in which the cover covers live components of the drive device during operation of the drive device, into a second position, in which the components are exposed, and a first connection means to which a second connection means is connectable to establish an electrically conductive connection and/or a data connection.

In addition, the invention relates to a vehicle.

Drive devices for electrically drivable vehicles typically have movable covers to allow maintenance of components located between the cover and a housing body covered by the cover. If these components carry a voltage of more than 60 volts during operation of the drive device, safety measures are usually provided to prevent accidental or impermissible contact with the components when they are live.

Document DE 20 2015 006 792 U1 discloses an electric vehicle with an electrical assembly that has a safety device to protect against dangerous contact voltages on an electrical component in the electrical assembly. The safety device comprises a service lid on an assembly housing of the electrical assembly, which lid closes a service opening to an interior of the housing for normal operation of the electrical assembly. The service lid is connected to the assembly housing by at least one service lid fastening means. Furthermore, the safety device has a safety moulding of the service lid with a recess and an enclosure of the recess formed by the safety moulding. For normal operation, a signal plug connection mechanically connected to the assembly housing can be passed through the recess, and the enclosure can be arranged between a signal socket and a signal plug of the signal plug connection connected to the signal socket. For servicing, the signal plug can be separated from the signal socket, with the enclosure being removable from the signal plug connection and the service lid being removable from the assembly housing.

A disadvantage of such a drive device is that, after removing the signal plug corresponding to the second connection means, it is possible to remove the cover from the housing body immediately if the fastening of the cover to the housing body has already been released. This is because the cover is then only still held in its first position by the second connection means. The cover can therefore be removed so quickly that a safety device that monitors the release of the second connection means cannot transfer the live components to a safe state in time before the cover is removed.

The invention thus addresses the problem of providing an improved possibility for protecting live components in a drive device against unwanted contact, in particular by making it more difficult to remove a cover covering the live components.

According to the invention, this problem is solved in a drive device of the type mentioned at the outset by arranging the first fastening means and the first connection means in such a way that, in the first position, access to the second fastening means in its position fastening the cover is only possible after the second connection means has been released from the first connection means.

The invention is based on the consideration of allowing the release of the fastening of the cover to the housing body, realised by the first and second fastening means, only after the release of the second connection means from the first connection means in order to thus create additional time and an additional level of difficulty for the transfer of the cover from the first position into the second position. It is thus advantageously made effectively more difficult to access the live components of the drive device, thus preventing the risk of accidental or impermissible contact, for example during maintenance or repair work.

The drive device according to the invention may further comprise the second fastening means and/or the second connection means. In addition, the housing body may have one or more third fastening means, each of which may interact with a fourth fastening means for fastening the cover to the housing. However, access to a particular fourth fastening means, which is in particular also part of the drive device, may be possible irrespective of the connection state of the first and second connection means.

It is preferred in the drive device according to the invention if the first connection means has a guide for the second connection means, the imaginary extension of which covers the first fastening means. The guide thus ensures that the second connection means is connected to the first connection means along a direction in which the second connection means covers the first fastening means or the second fastening means interacting therewith.

It may in particular be provided that the first fastening means and the first connection means are each arranged on a portion of the housing body, the portions being at an angle, in particular at right angles, to each other.

It is expediently provided that the first connection means is a connector, in particular formed as a socket, and/or the second connection means is a connector, in particular formed as a plug, and/or the first fastening means is a hole with an internal thread and/or the second fastening means is a screw.

The drive device according to the invention preferably further comprises a safety device which is set up to detect at least one critical state of the drive device and to trigger a safety function as a result of the detection of the critical state. The safety device is advantageously used to implement a multi-stage safety concept of the drive device, which further increases the protection against contact.

It is particularly preferred if the safety device is designed to detect the critical state when the connection means are not coupled to one another. This is particularly advantageous because the safety function may thus be triggered if the connection means are released from each other. Since access to the second fastening means is only provided after this release and additional time is required for the release thereof from the first fastening means, there is sufficient time to perform the safety function. It may be provided that the first connection means has a contact which is separable by removal of the second connection means, the critical state being detectable on account of the separation.

Alternatively or additionally, the safety device may be designed to detect a critical state when the cover is not in the first position. To do this, the safety device may in particular comprise a third connection means arranged on the housing body and a fourth connection means arranged on the cover, which are arranged in such a way that in the first position of the cover they form a connection with one another which is separable when the cover is transferred from the first position into the second position, the critical state being detectable on account of the separation.

It may also be provided that the safety device is designed to detect a critical state when no second fastening means interacts with the first fastening means. In particular, this may prevent the components from being energised when the cover is returned to the first position, the first and second connection means are coupled to one another, but the second fastening means does not interact with the first fastening means for fastening, so that the desired time delay would be inapplicable in the event of a subsequent attempt to transfer the cover from the first position into the second position.

The safety device may also have a current loop and an evaluation unit which is designed to detect the critical state on account of an interruption to the current loop. In this respect, the safety device can also be regarded as an interlock system.

The time delay implemented in accordance with the invention is particularly advantageous if the safety function involves discharging a capacitor of the drive device.

To this end, the safety device may have a discharge unit for discharging the capacitor. The discharge unit may be designed in particular as an active discharge unit.

In the drive device according to the invention it may advantageously be provided that the cover has a cover portion for covering a volume of the housing body accommodating the components and a fastening portion protruding from the cover portion on which the first and second fastening means act to fasten the cover. In particular, the fastening portion may be formed in tab-like fashion. Preferably, the fastening portion has a first portion which protrudes at an angle from the cover portion. The fastening portion may have a second portion which protrudes at an angle from the first portion. Preferably, the fixing portion has a through-opening through which the second fastening means can be passed. The through-opening in the second portion is particularly preferred.

In accordance with a preferred embodiment of the drive device according to the invention, it is provided that the housing body and the cover form a hinge by means of which the cover is movable from the first position into the second position by pivoting. Such a pivotable arrangement of the cover on the housing body may be made possible precisely because the first connection means does not have to penetrate the cover, as provided for example in document DE 20 2015 006 792 U1.

The drive device according to the invention advantageously further comprises an electric machine and a power converter, wherein the components coverable by the cover comprise electric lines connecting the electric machine and the power converter. The cover and the part of the housing body covered by the cover may be regarded to be a junction box or terminal box in this regard. Typically, the aforementioned capacitor is an intermediate circuit capacitor of the power converter.

The problem addressed by the invention is further solved by a vehicle comprising a drive device according to the invention. The vehicle is for example an electric vehicle or a hybrid vehicle.

Figure 2:
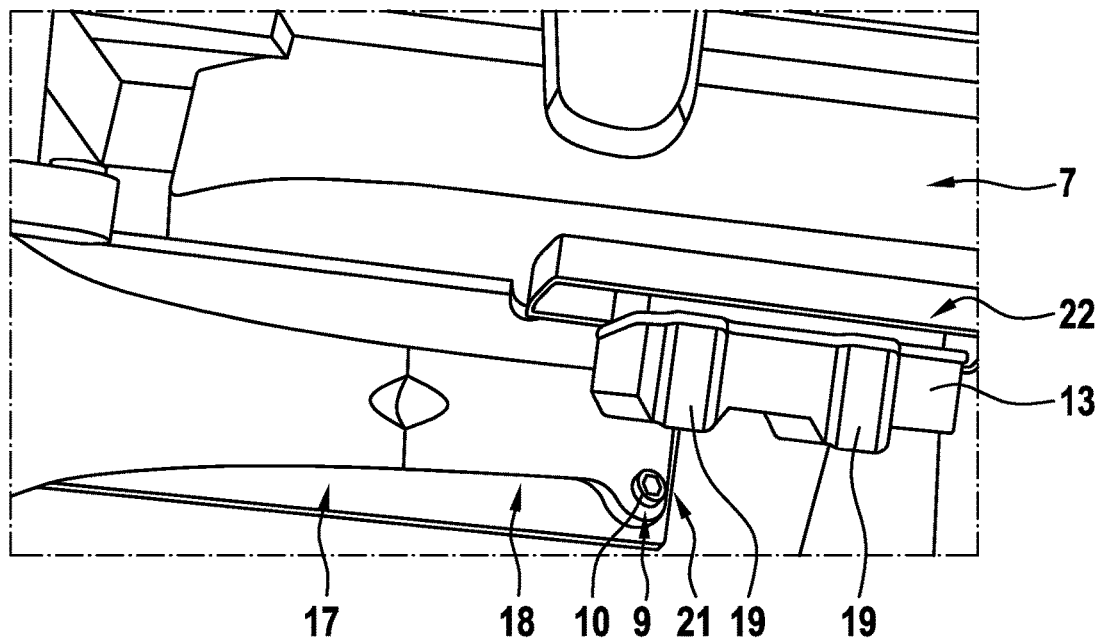
Figure 3:
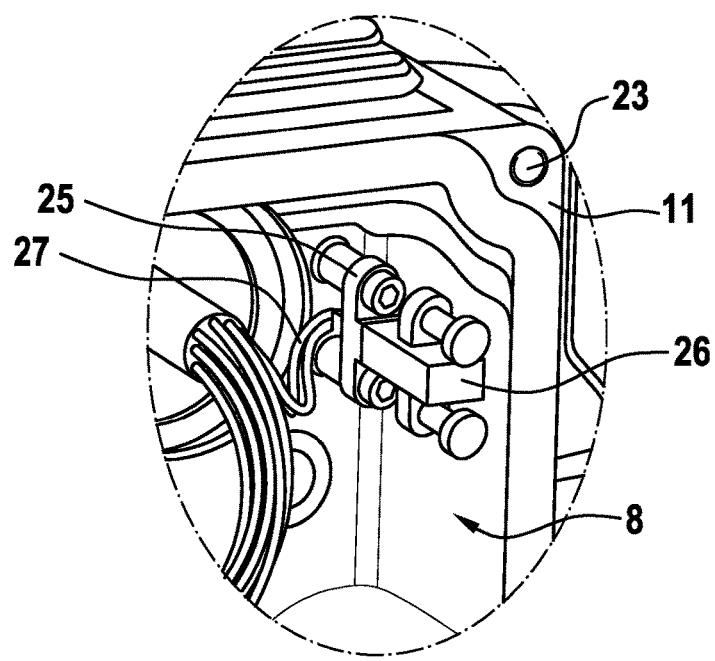
Figure 4:
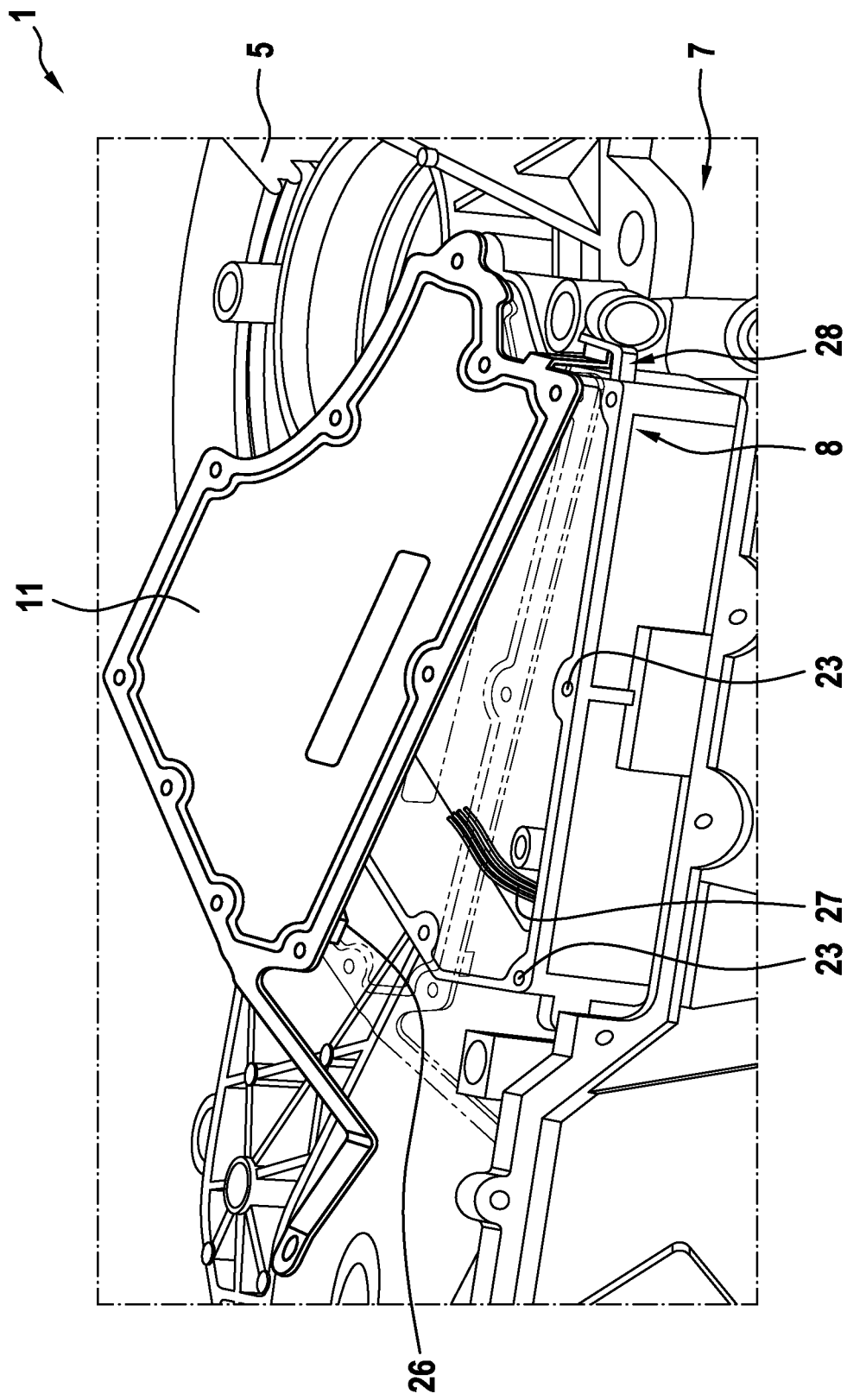
Figure 5:
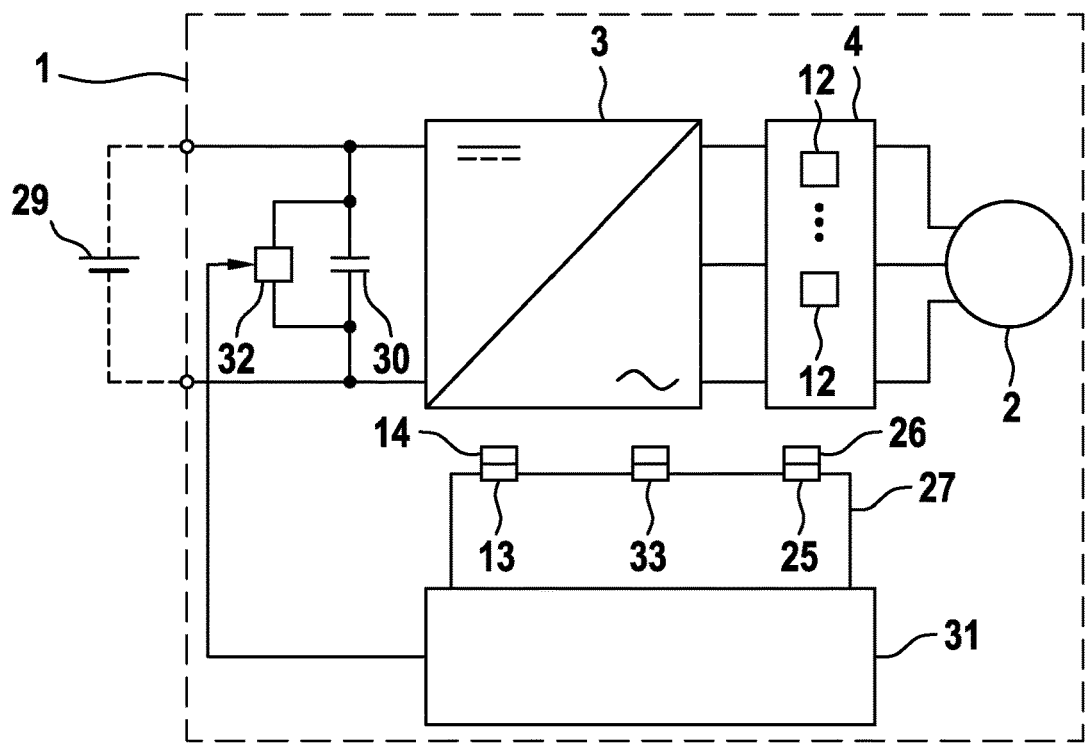
Figure 6:
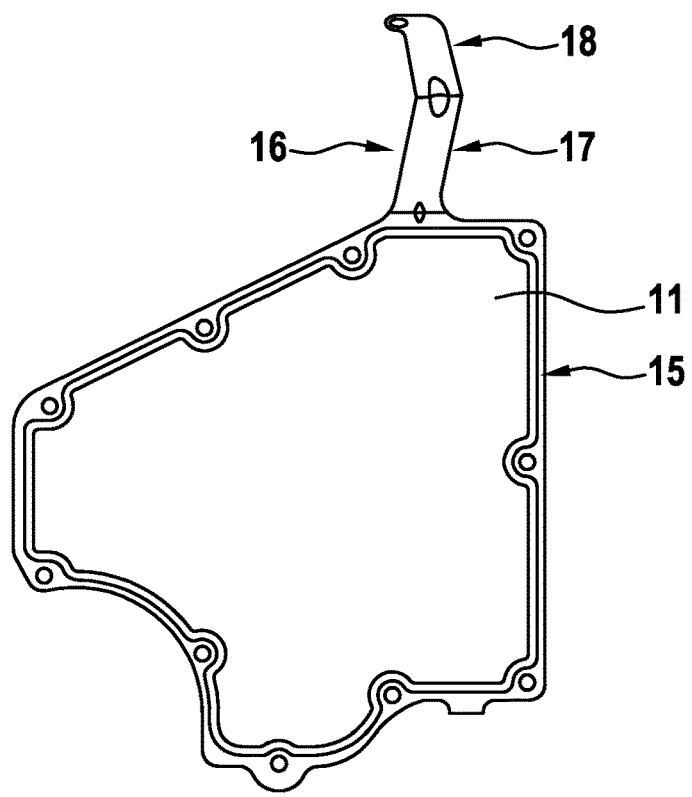
Figure 7:
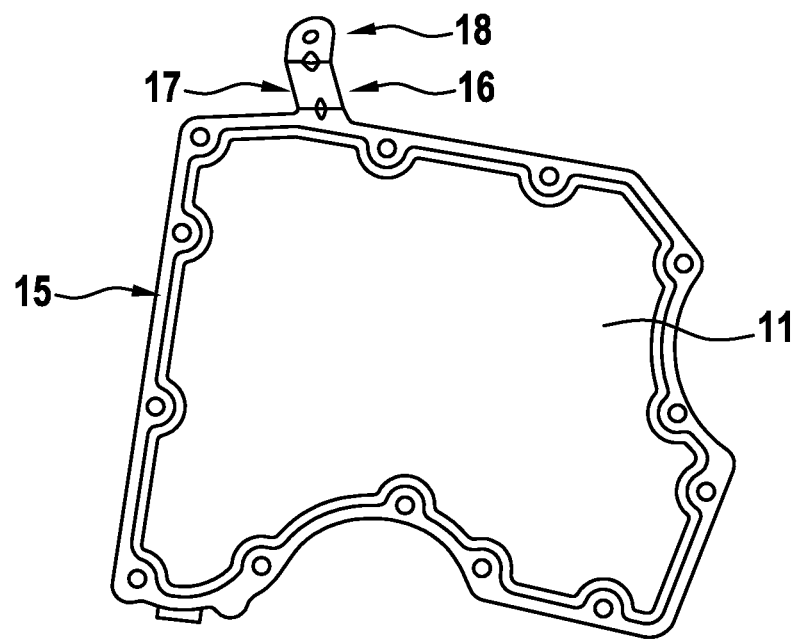
Figure 8:
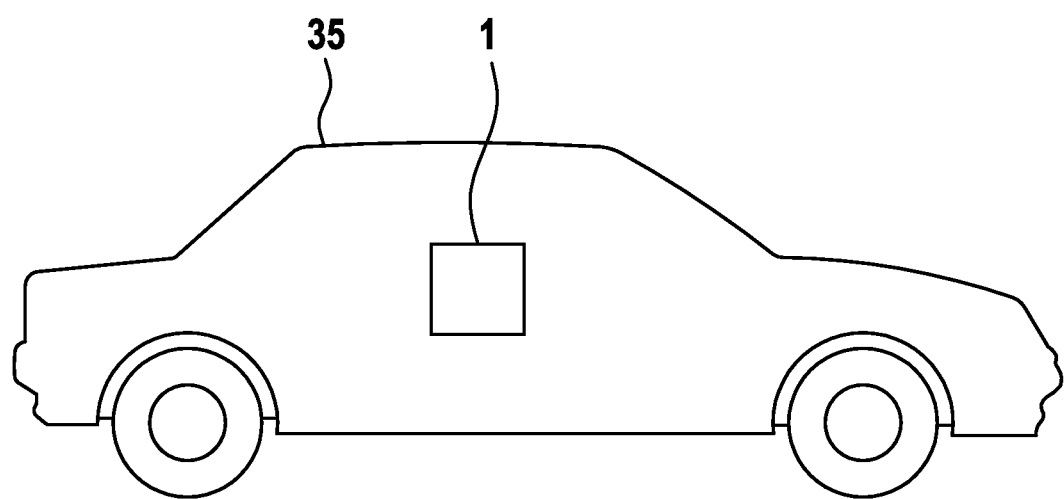

Further advantages and details of the present invention will become clear from the exemplary embodiments described hereinafter and with reference to the drawings. These are schematic representations and show:

FIG. 1 a plan view of a first exemplary embodiment of the drive device according to the invention;

FIGS. 2 and 3 in each case a detailed view of the drive device shown in FIG. 1;

FIG. 4 a perspective view of the drive device shown in FIG. 1 when a cover is transferred from a first position into a second position;

FIG. 5 a block diagram of the drive device shown in FIG. 1;

FIGS. 6 and 7 in each case a perspective view of a cover of a further exemplary embodiment of the drive device according to the invention; and FIG. 8 a basic sketch of an exemplary embodiment of the vehicle according to the invention.

FIG. 1 is a plan view of a first exemplary embodiment of a drive device 1. This comprises an electric machine 2, a power converter 3, and a connection device 4, which produces the electrical connection of the electric machine 2 and the power converter 3.

The electric machine 1 has a housing body 5, which is divided into a first housing portion 6 for the electric machine 2, a second housing portion 7 for the power converter, and a third housing portion 8 for the connection device 4. In the second housing portion 7, the housing body 5 comprises a first fastening means 9 in the form of a hole with an internal thread. A second fastening means 10 in the form of a screw is provided to fasten a cover 11 of the drive device 1 to the housing body 5 in interaction with the first fastening means 9. In the present exemplary embodiment, the cover 11 covers the third housing portion 8, in which purely schematically shown live components 12 are arranged. FIG. 1 shows the cover 11 in a first position, in which it closes the third housing portion 8 and is fastened to the housing body 5, in this case specifically to the second housing portion 7, by way of the fastening means 9, 10.

The drive device 1 further comprises a first connection means 13, to which a second connection means 14 is attachable for establishing an electrically conductive connection and a data connection. The first connection means 13 is a connector formed as a socket, which is passed through an opening in the second housing portion 7. The second connection means 14 is, accordingly, a connector formed as a plug.

It can be seen that the first fastening means 9 and the first connection means 13 are arranged in such a way that, in the first position, access to the second fastening means 10 in its position fastening the cover 11 is possible only after the second connection means 14 has been released from the first connection means 13. This is realised by the fact that the second connection means 14 covers the first and the second fastening means 9, 10 in the connected state.

The cover 11 comprises a cover portion 15 for covering a volume of the housing body 4 or the third housing portion 8 in which the components 12 are accommodated, and a fastening portion 16 which protrudes at an angle from the cover portion 15 and on which the first and second fastening means 9, 10 act to fasten the cover 11. The fastening portion 16 has a first portion 17 which extends at an angle from the cover portion 15 into the drawing plane of FIG. 1, and a second portion 18 which in turn extends parallel to the cover portion 15 and rests on the second housing portion 7 of the housing body 5. In the second portion 18 a through-opening is formed, which penetrates the second fastening means 10 for fastening the cover 11.

FIG. 2 is a detailed view of the drive device 1 in the region of the first connection means, however the second connection means 14 is not shown.

The first connection means 13 has a guide 19 for the second connection means 14, the imaginary extension of which covers the first fastening means 9, so that the second connecting means 14 (see FIG. 1) covers the fastening means 9, 10 when connected. For this purpose, the first fastening means 9 is formed in a portion 21 of the housing body 5 or the second housing portion 7, which runs at right angles to a further portion 22 of the housing body 5 or the second housing portion 7, on which the first connection means 13 is arranged.

Again with reference to FIG. 1, the drive device 1 comprises a plurality of third fastening means 23 in the form of holes with an internal thread and a corresponding number of second fastening means 24 each in the form of a screw. For reasons of clarity, only two of the third and fourth fastening means 23, 24 are provided with reference signs in FIG. 1. By means of the third and fourth fastening means 23, 24, the cover portion 15 of the cover 11 is fastenable to the third housing portion 8. It can be seen that access to the fourth fastening means 24 is possible regardless of the connection status of the first and second connection means 13, 14.

FIG. 3 is a further detailed view of the drive device 1, which shows a detail of the volume of the third housing portion 8 covered by the cover 11 without the cover 11.

Within this volume, a third connection means 25 is arranged, which is fastened to the housing body 5. A fourth connection means 26 is fastened to the cover 11 and is connected to the third connection means 25 in the first position of the cover 11.

In this position the fourth connection means 26 produces an electrically conductive connection of a conductor loop 27.

FIG. 4 is a perspective view of the drive device 1 when transferring the cover 11 from the first position into a second position.

For the transfer, the second connection means 14 must first be released from the first connection means 13 and the fourth fastening means 24 from the third fastening means 23. Since the second connection means 14 is released from the first connection means 13, it is only now that the second fastening means 10 can be accessed in order to release it from the first fastening means 9. This allows the cover 11 to be transferred from the first position into the second position, in which access to the components 12 is possible. It is also possible to see that the third connection means 25 and the fourth connection means 26 are separated from each other, thus interrupting the conductor loop 27. In the present exemplary embodiment, the third housing portion 8 and the cover 11 form a hinge 28, which makes it possible to move the cover 11 from the first position to the second position by pivoting.

FIG. 5 is a block diagram of the drive unit 1.

In the present exemplary embodiment, the power converter 3 is formed as an inverter that converts a direct voltage provided by a high-voltage battery 29 into a three-phase alternating voltage for the electric machine 2. It can be seen that the connection device 4 establishes a corresponding electrical connection between the power converter 3 and the electric machine 2. In addition, the power converter 3 comprises a capacitor 30 provided as an intermediate circuit capacitor.

The drive device 1 also has a safety device which comprises the conductor loop 27, an evaluation unit 31 and an active discharge device 32. It can be seen that the conductor loop 27 connects the first connection means 13, the third connection means 25 and an optional further detection unit 33. The conductor loop 27 is interrupted if the second connection means 14 is released from the first connection means 13, if the fourth connection means 26 is released from the third connection means 25, and by means of the detection unit 33 if the second fastening means 10 is released from the first fastening means 9. Interruptions are detected by the evaluation unit 31 as a critical state. If a critical state is detected, the evaluation unit 31 triggers a safety function, which comprises discharging the intermediate circuit capacitor 30 by means of the discharge device 32.

Consequently, when the second connection means 14 is released from the first connection means 13, the discharge of the capacitor 30 is triggered. Since the second connection means 10 must first be released from the first connection means 9, which is only exposed when the second connection means 14 is removed, there is sufficient time for the capacitor 30 to discharge. When the fourth fastening means 24 is also released from the third fastening means 23 and the cover 11 is transferred from the first position into the second position, the conductor loop 27 is interrupted as a redundant safety measure due to the disconnection of the fourth connection means 26 from the third connection means 25, which would also trigger the discharge if the removal of the second connection means 14 from the first connection means 13 had not been correctly detected. In order to prevent the second fastening means and the first fastening means 9 from not being used when the cover 11 is reattached to the housing body 5, thus enabling the cover 11 to be opened immediately after the second connection means 14 has been released again from the first connection means 13, the efficacy of the safety device can be further increased by the additional detection unit 33.

A sticker 34 with a warning notice attached to the cover 11 and visible from the outside supplements the safety concept of the drive device 1 described above.

FIGS. 6 and 7 are each perspective views of a cover 11 of a further exemplary embodiment of the drive device according to the invention. It can be seen that the portions 17, 18 of the cover 11 according to FIG. 6 are longer than those of the cover 11 according to FIG. 7. The fastening portions 16 protrude here at right angles from cover portion 15.

FIG. 8 is a basic sketch of an exemplary embodiment of a vehicle 35, which comprises a drive device 1 according to one of the previously described exemplary embodiments. The drive device 1 is designed to drive the vehicle 35, which may be, accordingly, an electric vehicle or a hybrid vehicle.

The invention claimed is:

1. A drive device for an electrically drivable vehicle, comprising:
    a housing body with a first fastening means,
    a second fastening means engageable with the first fastening means,
    a cover which, after release of the second fastening means interacting with the first fastening means for fastening the cover to the housing body, is movable from a first position, in which the cover covers components of the drive device during operation of the drive device, into a second position, in which the components are exposed, and
    a first connection means, to which a second connection means is connectable to establish an electrically conductive connection and/or a data connection,
    wherein the first fastening means and the first connection means are arranged in such a way that access to the second fastening means in the first position fastening the cover is only possible after the second connection means has been released from the first connection means.

2. The drive device according to claim 1, wherein the first connection means has a guide for the second connection means, an imaginary extension of which covers the first fastening means.

3. The drive device according to claim 1, wherein the first fastening means and the first connection means are each arranged on a portion of the housing body, the portions extending at right angles to one another.

4. The drive device according to claim 1, wherein the first connection means is a socket, and/or the second connection means is a plug, and/or the first fastening means is a hole with an internal thread and/or the second fastening means is a screw.

5. The drive device according to claim 1, further comprising a safety device which is designed to detect at least one critical state of the drive device and to trigger a safety function as a result of the detection of the critical state.

6. The drive device according to claim 5, wherein the safety device is designed to detect a critical state if
the first and second connection means are not coupled to one another and/or
the cover is not in the first position and/or
no second fastening means interacts with the first fastening means.

7. The drive device according to claim 5, wherein the safety function comprises discharging a capacitor of the drive device.

8. The drive device according to claim 1, wherein the cover comprises a cover portion for covering a volume of the housing body accommodating the components and a fastening portion, which protrudes from the cover portion and on which the first and second fastening means act for fastening the cover.

9. The drive device according to claim 1, wherein the housing body and the cover form a hinge by means of which the cover is movable from the first position into the second position by pivoting.

10. The drive device according to claim 1, further comprising an electric machine and a power converter, wherein the components coverable by the cover comprise electrical lines which connect the electric machine and the power converter.

11. A vehicle comprising the drive device according to claim 1.

12. The drive device according to claim 1, wherein the second connecting means connected to the first connecting means is located above the first fastening means so that the second fastening means can be fastened to and removed from the first fastening means only when the second connecting means is removed from the first connecting means.

* * * * *